United States Patent
Ko

(10) Patent No.: US 7,521,977 B2
(45) Date of Patent: Apr. 21, 2009

(54) VOLTAGE-CONTROLLED OSCILLATOR GENERATING OUTPUT SIGNAL FINELY TUNABLE IN WIDE FREQUENCY RANGE AND VARIABLE DELAY CIRCUITS INCLUDED THEREIN

(75) Inventor: Jae Gan Ko, Bucheon-si (KR)

(73) Assignee: TLI Inc. (KR)

( * ) Notice: Subject to any disclaimer, the term of this patent is extended or adjusted under 35 U.S.C. 154(b) by 0 days.

(21) Appl. No.: 11/776,684

(22) Filed: Jul. 12, 2007

(65) Prior Publication Data

US 2008/0272818 A1 Nov. 6, 2008

(30) Foreign Application Priority Data

May 2, 2007 (KR) .................... 10-2007-0042491

(51) Int. Cl.
*H03H 11/26* (2006.01)
(52) U.S. Cl. .................... 327/276; 327/68; 327/246; 327/266; 327/274
(58) Field of Classification Search .............. None
See application file for complete search history.

(56) References Cited

U.S. PATENT DOCUMENTS

| | | | | |
|---|---|---|---|---|
| 6,094,103 A * | 7/2000 | Jeong et al. | .................... | 331/57 |
| 6,351,191 B1 * | 2/2002 | Nair et al. | .................... | 331/57 |
| 6,774,689 B1 * | 8/2004 | Sudjian | .................... | 327/158 |
| 6,940,331 B2 * | 9/2005 | Kim | .................... | 327/270 |
| 7,205,813 B2 * | 4/2007 | Kang | .................... | 327/287 |
| 2003/0052719 A1 * | 3/2003 | Na | .................... | 327/158 |

FOREIGN PATENT DOCUMENTS

| | | |
|---|---|---|
| KR | 1020040057138 | 7/2004 |
| KR | 1020050011316 | 1/2005 |
| KR | 1020070008398 | 1/2007 |

* cited by examiner

*Primary Examiner*—Lincoln Donovan
*Assistant Examiner*—An T Luu
(74) *Attorney, Agent, or Firm*—Cantor Colburn LLP

(57) ABSTRACT

A voltage-controlled oscillator includes a plurality of variable delay circuits, wherein a first differential output signal of an adjacent previous stage is provided as a first differential input signal and a second differential output signal of a second previous stage is provided as a second differential input signal. Each variable delay circuit includes a loading circuit including first and second loading units, a first input circuit including first and second input transistors gated by the first differential input signal, a second input circuit including third and fourth input transistors gated by the second differential input signal, first and second current sources connected between a first common node and a second power source and in electrical parallel with each other, and third and fourth current sources connected between a second common node and the second power source and in electrical parallel with each other.

13 Claims, 15 Drawing Sheets

VOLTAGE-CONTROLLED OSCILLATOR GENERATING OUTPUT SIGNAL FINELY TUNABLE IN WIDE FREQUENCY RANGE AND VARIABLE DELAY CIRCUITS INCLUDED THEREIN

This application claims priority to Korean Patent Application No. 2007-0042491, filed on May 2, 2007, and all the benefits accruing therefrom under 35 U.S.C. § 119, the contents of which in its entirety are herein incorporated by reference.

BACKGROUND OF THE INVENTION

1. Field of the Invention

The present invention relates to a voltage-controlled oscillator including variable delay circuits and, more particularly, to a voltage-controlled oscillator including variable delay circuits which generates a precisely tunable output signal having a wide frequency range.

2. Description of the Related Art

Phase-locked loops ("PLLs") are widely used in clocks, for synthesizing frequency components, and for demodulating and modulating signals in communication and control systems. An important component of a PLL is a voltage-controlled oscillator. A basic function of the voltage-controlled oscillator is varying frequency according to a control voltage.

FIG. 1 is a schematic circuit diagram of a voltage-controlled oscillator of the prior art. The voltage-controlled oscillator of the prior art shown in FIG. 1 includes variable delay circuits 11, 12, 13 and 14. Each variable delay circuit 11, 12, 13 and 14 is configured to receive a respective previous differential output signal pair UP/UN from an associated adjacent previous variable delay circuit as a next differential input signal pair IP/IN.

FIG. 2 is a schematic circuit diagram of an individual variable delay circuit, e.g., one of the variable delay circuits 11, 12, 13 and 14, of the voltage-controlled oscillator of the prior art in FIG. 1. FIG. 3 is a graph of control voltage versus frequency in the voltage-controlled oscillator of the prior art in FIG. 1.

The individual variable delay circuit shown in FIG. 2 includes first and second loading circuits 21 and 22, respectively, n-channel metal-oxide semiconductor ("NMOS") transistors 23 and 24 and a current source 25. The first and second loading circuits 21 and 22 receive a supply voltage VDD and are controlled by a control signal $V_{CON}$.

The NMOS transistors 23 and 24 are connected to the first and second loading circuits 21 and 22, respectively, and are gated by signals IP and IN, respectively, of the differential input signal pair IP/IN. The current source 25 includes an NMOS transistor gated by a source bias voltage VNB.

As shown in FIGS. 2 and 3, a frequency variation of the voltage-controlled oscillator corresponding to a given change of the control voltage $V_{CON}$ is determined by a voltage level of the source bias voltage VNB. For example, when the source bias voltage VNB is high (corresponds to line (i) of FIG. 3) a frequency variation corresponding to the given change in the control voltage $V_{CON}$ is large in comparison to when the source bias voltage VNB is low (corresponds to line (ii) of FIG. 3), wherein a frequency variation to the given change in the control voltage $V_{CON}$ is smaller.

Further, to have a wide frequency range, the voltage-controlled oscillator is required to have a large frequency variation in response to the control voltage $V_{CON}$. However, since a frequency of the differential output signal pair UN and UP is sensitive to a noise of the control voltage $V_{CON}$, it is difficult to precisely adjust the frequency of the differential output signal pair UP/UN. To compensate for this, a frequency variation in response to the control voltage $V_{CON}$ is set to be lower, and it is therefore easier to precisely adjust the frequency variation, but this reduces a frequency range of the voltage-controlled oscillator, and the reduced frequency range is insufficient.

BRIEF SUMMARY OF THE INVENTION

Exemplary embodiments of the present invention provide a voltage-controlled oscillator including variable delay circuits which is capable of precisely adjusting a frequency of a differential output signal pair over a wide range of frequency.

According to one exemplary embodiment of the present invention, a variable delay circuit includes a first loading node and a second loading node, a first common node and a second common node, a loading circuit including a first loading unit disposed between a first power source and the first loading node and a second loading unit disposed between the first power source and the second loading node, a first input circuit including a first input transistor disposed between the first loading node and the first common node and a second input transistor disposed between the second loading node and the first common node.

The first input transistor and the second input transistor are gated by a first differential input signal and a second differential input signal, respectively;

The variable delay circuit further includes a second input circuit including a third input transistor disposed between the first loading node and the second common node and a fourth input transistor disposed between the second loading node and the second common node.

The third input transistor and the fourth input transistor are gated by a third differential input signal and a fourth differential input signal, respectively.

The variable delay circuit further includes a first source circuit disposed between the first common node and a second power source and a second source circuit disposed between the second common node and the second power source.

The first source circuit includes a first current source and a second current source connected in electrical parallel with each other and disposed between the first common node and the second power source. The second source circuit includes a third current source and a fourth current source connected in electrical parallel with each other and disposed between the second common node and the second power source.

The second current source and the third current source are supplied with a bias current. Further, the second current source includes a first reference source transistor disposed between the first common node and the second power source, and the third current source includes a second reference source transistor disposed between the second common node and the second power source.

The first reference source transistor and the second reference source transistor are gated by a reference bias voltage.

The first current source and the fourth current source are configured to maintain a current sum through the first and fourth current sources at a predetermined level.

The first current source include a first variable source transistor gated by a first variable bias voltage and the second current source includes a second variable source transistor gated by a second variable bias voltage.

The first loading unit includes a first diode and a first loading transistor connected in electrical parallel with each other and disposed between the first power source and the first loading node, and the second loading unit includes a second diode and a second loading transistor connected in electrical parallel with each other and disposed between the first power source and the second loading node.

The first loading transistor and the second loading transistor are gated by a control voltage.

In another exemplary embodiment of the present invention, a voltage-controlled oscillator ("VCO") includes pluralities of variable delay circuits, each of which receives a first differential output signal of an adjacent, e.g., a first previous, stage as a first differential input signal and receives a second differential output signal of an n-th previous stage (where n is an integer and $n \geq 2$) as a second differential input signal.

In an alternative exemplary embodiment, n is equal to 2.

In yet another exemplary embodiment of the present invention, a VCO includes a plurality of variable delay circuits, each of which receives a first differential output signal of an adjacent, e.g., a first previous, stage as a first differential input signal and receives a second differential output signal of an n-th previous stage (where n is an integer and $n \geq 2$) as a second differential input signal.

In an alternative exemplary embodiment, n is equal to 2.

Each variable delay circuit of the VCO includes: a first loading node and a second loading node; a first common node and a second common node; a loading circuit including a first loading unit disposed between a first power source and the first loading node and a second loading unit disposed between the first power source and the second loading node and a first input circuit including a first input transistor disposed between the first loading node and the first common node and a second input transistor disposed between the second loading node and the first common node.

The first input transistor and the second input transistor are gated by a first differential input signal pair.

Each variable delay circuit of the VCO further includes a second input circuit including a third input transistor disposed between the first loading node and the second common node and a fourth input transistor disposed between the second loading node and the second common node.

The third input transistor and the fourth input transistors are gated by the second differential input signal.

Each variable delay circuit of the VCO further includes a first source circuit disposed between the first common node and a second power source and a second source circuit disposed between the second common node and the second power source.

The first source circuit includes a first current source and a second current source connected in electrical parallel with each other and disposed between the first common node and the second power source.

The second source circuit includes a third current source and a fourth current source connected in electrical parallel with each other and disposed between the second common node and the second power source.

The second current source and the third current source are supplied with a bias current.

The second current source includes a first reference source transistor disposed between the first common node and the second power source and the third current source includes a second reference source transistor disposed between the second common node and the second power source.

The first reference source transistor and the second reference source transistor are gated by a reference bias voltage.

The first current source and the fourth current source are configured to maintain a current sum through the first current source and the fourth current source at a predetermined level.

The first current source comprises a first variable source transistor gated by a first variable bias voltage, and the second current source includes a second variable source transistor gated by a second variable bias voltage.

The first loading unit includes a first diode and a first loading transistor connected in electrical parallel with each other and disposed between the first power source and the first loading node, and the second loading unit includes a second diode and a second loading transistor connected in electrical parallel with each other and disposed between the first power source and the second loading node.

The first loading transistor and the second loading transistor are gated by a control voltage.

BRIEF DESCRIPTION OF THE DRAWINGS

The above and other aspects, features and advantages of the present invention will become more apparent by describing in further detail exemplary embodiments thereof with reference to the accompanying drawings, in which.

DETAILED DESCRIPTION OF THE INVENTION

Figure 1:
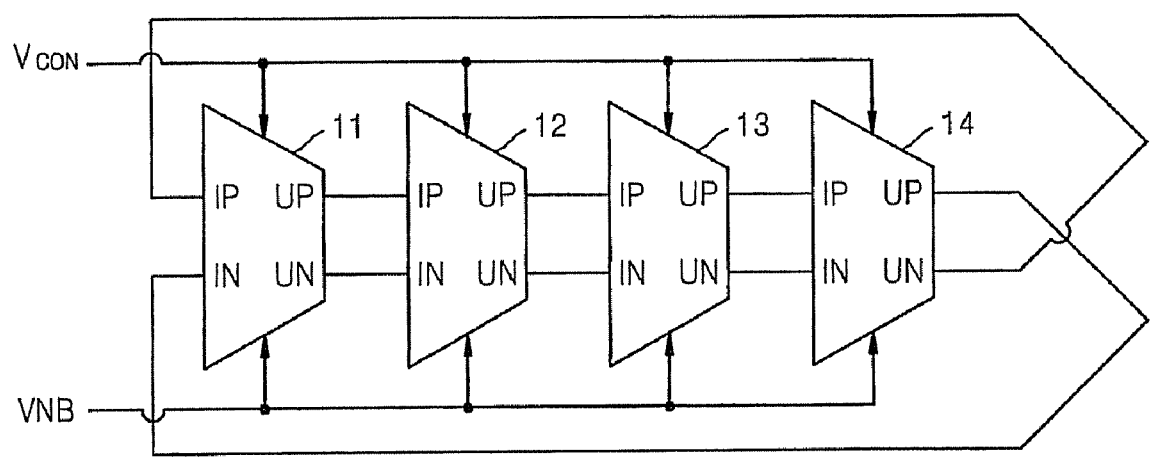
FIG. 1 is a schematic circuit diagram of a voltage-controlled oscillator of the prior art.
Figure 2:
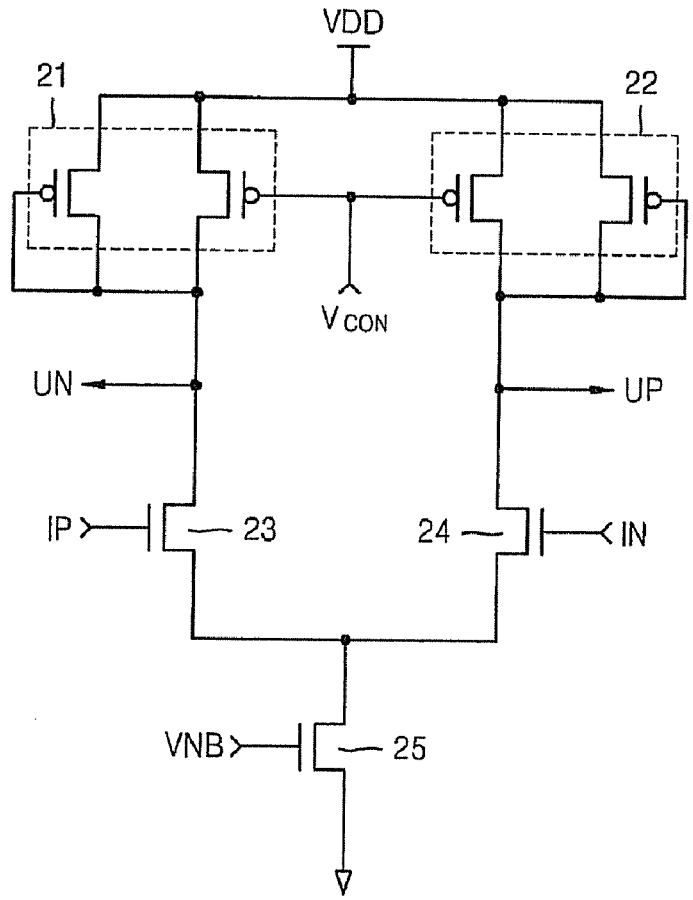
FIG. 2 is a schematic circuit diagram of an individual variable delay circuit of the voltage-controlled oscillator of the prior art in FIG. 1.
Figure 3:
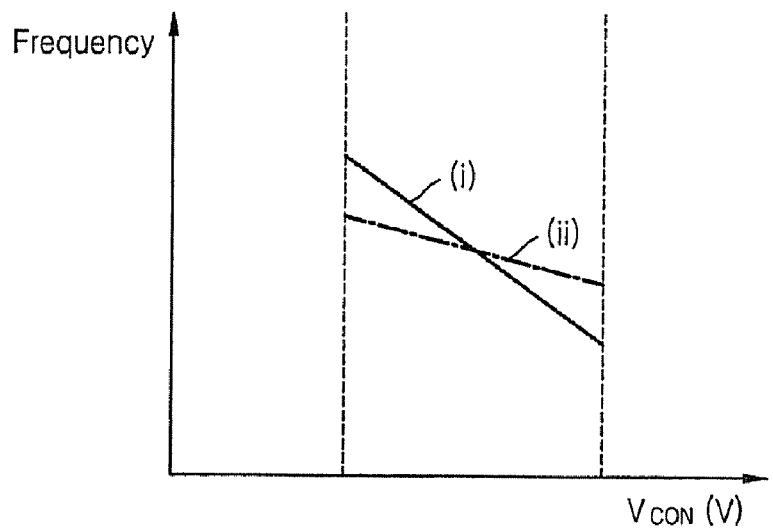
FIG. 3 is a graph of control voltage versus frequency in the voltage-controlled oscillator of the prior art in FIG. 1.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, an exemplary embodiment of the present invention will be described in further detail with reference to the accompanying drawings.

Figure 4:
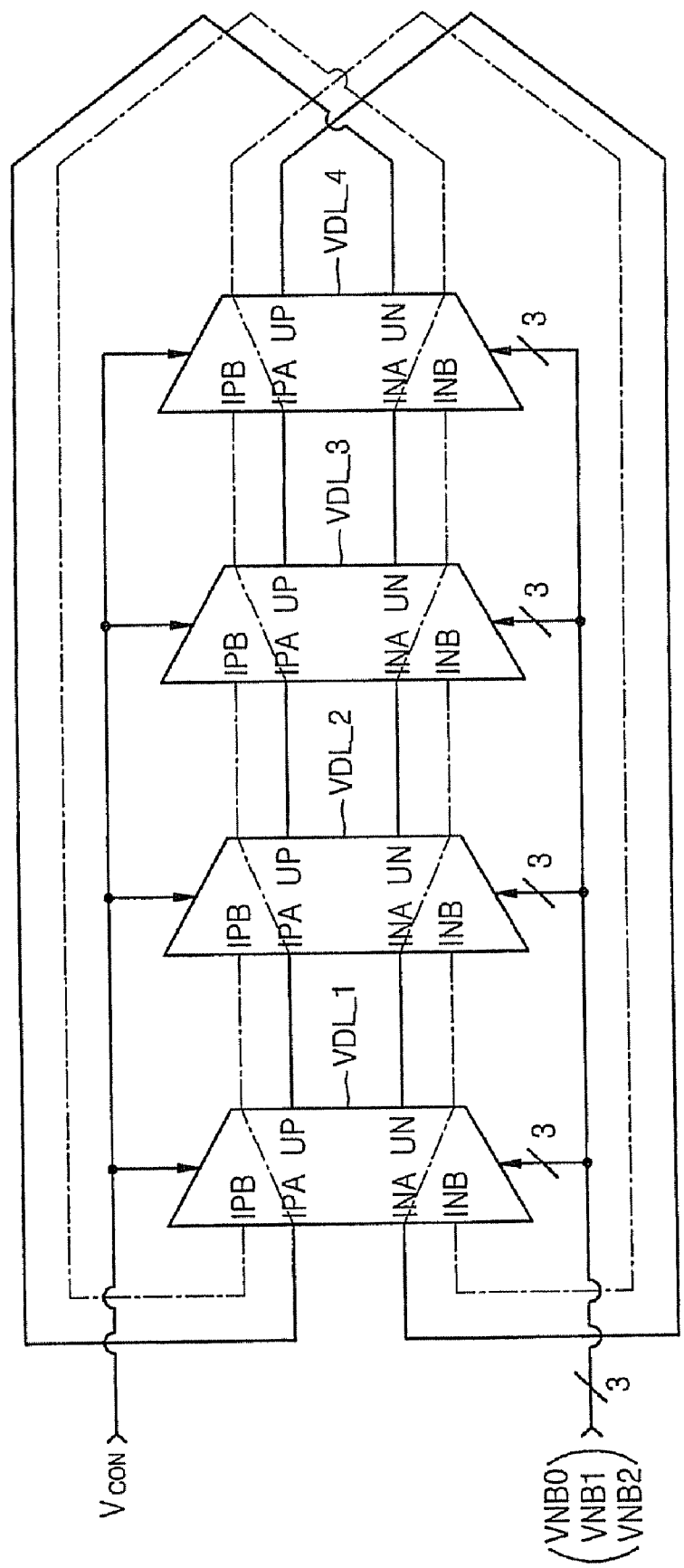
FIG. 4 is a schematic circuit diagram of a voltage-controlled oscillator according to an exemplary embodiment of the present invention.

FIG. 4 is a schematic circuit diagram of a voltage-controlled oscillator according to an exemplary embodiment of the present invention. Referring to FIG. 4, the voltage-controlled oscillator includes variable delay circuits VDL_1, VDL_2, VDL_3 and VDL_4. For simplicity, discussion herein will be with reference to the third variable delay circuit VDL_3. However, features of the other variable delay circuits VDL_1, VDL_2 and VDL_4 are similar thereto, as will be understood by those of ordinary skill in the art.

Referring to FIG. 4, the third variable delay circuit VDL_3 receives a differential output signal UP and a differential output signal UN (hereinafter collectively referred to as a "differential output signal pair UP/UN") of the second variable delay circuit VDL_2 (e.g., the previous adjacent stage to VDL_3) as a first differential input signal IPA and a first differential input signal INA (hereinafter collectively referred to as a "a first differential input signal pair IPA/INA"), and receives a differential output signal pair UP/UN of the first variable delay circuit VDL_1 (e.g., the second previous stage to VDL_3) as a second differential input signal IPB and a second differential output signal INB (hereinafter collectively referred to as "second differential output signal pair IPB/INB"). Finally, a differential output signal pair UP/UN of the fourth variable delay circuit (e.g., the last stage) VDL_4 is provided as a first differential input signal pair IPA/INA of the first variable delay circuit VDL_1, and a differential output signal pair UP/UN of the third variable delay circuit VDL_3 (e.g., the previous stage to the last stage) is provided as a second differential input signal pair IPB/INB of the first variable delay circuit VDL_1 (e.g., the first stage).

In one exemplary embodiment in which the voltage-controlled oscillator is implemented with an even number of variable delay circuits, the differential output signal pairs of the last stage variable delay circuit (e.g., VDL_4) and the previous stage variable delay circuit (e.g., VDL_3) of the last stage variable delay circuit are cross-coupled to the differential input signal pairs of the first stage variable delay circuit (e.g., VDL_1). More specifically, in cross-coupling, the differential output UN of the fourth variable delay circuit VDL_4 is connected to the first differential input signal IPA of the first variable delay circuit VDL_1 instead of being connected to the first differential input signal pair INA of the first variable delay circuit VDL_1, as would be the case without cross coupling.

In alternative exemplary embodiments in which the voltage-controlled oscillator includes an odd number of variable delay circuits, the differential output signal pairs UP/UN of the last stage variable delay circuit and the previous stage variable delay circuit may be provided to the differential input signal pairs IPA/INA of the first stage variable delay circuit without cross-coupling.

Figure 5:
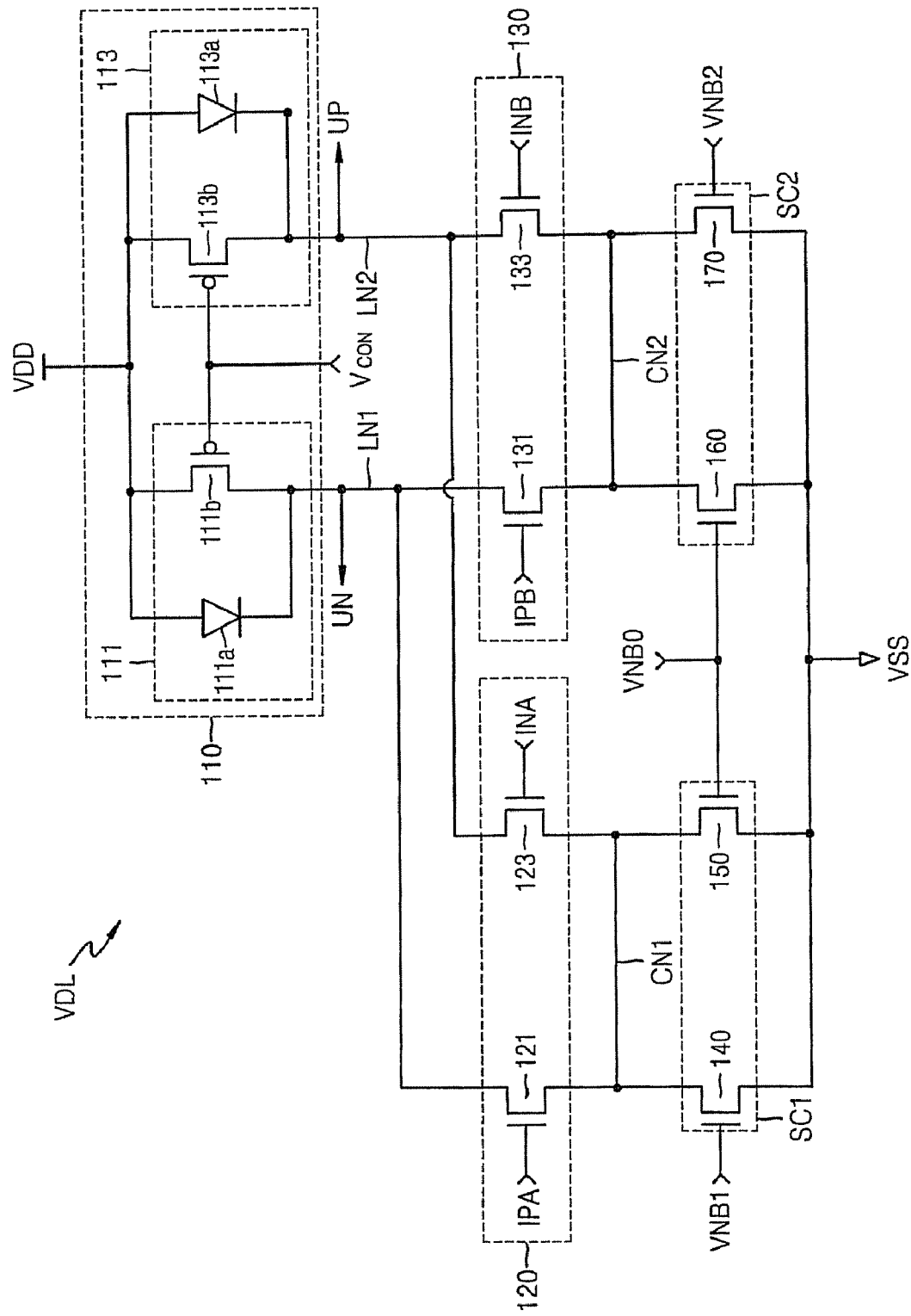
FIG. 5 is a schematic circuit diagram of a variable delay circuit of the voltage-controlled oscillator according to the exemplary embodiment of the present invention in FIG. 4.

FIG. 5 is a schematic circuit diagram of a variable delay circuit of the voltage-controlled oscillator according to the exemplary embodiment of the present invention in FIG. 4. As stated earlier, each of the variable delay circuits VDL_1, VDL_2, VDL_3 and VDL_4 has substantially the same structure as the variable delay circuit shown in FIG. 5.

Referring to FIG. 5, a variable delay circuit VDL includes first and second loading nodes LN1 and LN2, respectively, first and second common nodes CN1 and CN2, respectively, a loading circuit 110, a first input circuit 120, a second input circuit 130 and first and second source circuits SC1 and SC2, respectively.

The differential output signal pair UP/UN of the variable delay circuit VDL is supplied through the first and second loading nodes LN1 and LN2.

The loading circuit 110 includes first and second loading units 111 and 113, respectively. The first loading unit 111 is connected between a first power source VDD and the first loading node LN1. In one exemplary embodiment, the first loading unit 111 includes a first loading diode 111a and a first loading transistor 111b connected in electrical parallel with each other between the first power source VDD and the first loading node LN1, as shown in FIG. 5.

In a substantially similar manner, the second loading unit 113 is connected between the first power source VDD and the second loading node LN2. In one exemplary embodiment, the second loading unit 113 includes a second loading diode 113a and a second loading transistor 113b connected in electrical parallel with each other between the first power source VDD and the second loading node LN2, as shown in FIG. 5.

Further, in one exemplary embodiment, the first and second loading diodes 111a and 113a are substantially equivalent. Likewise, the first and second loading transistors 111b and 113b are substantially equivalent and are commonly gated by the control voltage $V_{CON}$. Thus, the first loading unit 111 has a resistive component substantially equivalent to a resistive component of the second loading unit 113, e.g., the first and second loading units 113 and 113 are balanced.

Still referring to FIG. 5, the first input circuit 120 includes first and second input transistors 121 and 123, respectively. The first input transistor 121 is connected between the first loading node LN1 and the first common node CN1, and the second input transistor 123 is connected between the second loading node LN2 and the first common node CN1. The first and second input transistors 121 and 123 are gated by the first differential input signals IPA and INA, respectively, of the first differential input signal pair IPA/INA.

The second input circuit 130 includes third and fourth input transistors 131 and 133, respectively. The third input transistor 131 is connected between the first loading node LN1 and the second common node CN2, and the fourth input transistor 123 is connected between the second loading node LN2 and the second common node CN2. The third and fourth input transistors 131 and 133 are gated by the second differential input signal IPB and the second differential input signal INB, respectively, of the second differential input signal pair IPB/INB.

The first source circuit SC1 is connected between the first common node CN1 and a second power source VSS. In one exemplary embodiment, the second power source is VSS is a ground voltage. The first source circuit SC1 includes first and second current sources 140 and 150, respectively. Further, the first and second current sources 140 and 150 are connected between the first common node CN1 and the second power source VSS in electrical parallel with each other, as shown in FIG. 5.

The second source circuit SC2 is connected between the second common node CN2 and the second power source VSS. The second source circuit SC2 includes third and fourth current sources 160 and 170, respectively. The third and fourth current sources 160 and 170 are connected in electrical parallel with each other between the second common node CN2 and the second power source VSS.

The second current source 150 includes a first reference source transistor connected between the first common node CN1 and the second power source VSS, and the third current source 160 includes a second reference source transistor connected between the second common node CN2 and the second power source VSS.

In one exemplary embodiment of the present invention, the first and second reference source transistors of the second and third current sources 150 and 160, respectively, are substantially equivalent n-channel metal-oxide semiconductor ("NMOS") transistors, commonly gated by a reference bias voltage VNB0, as shown in FIG. 5. Thus, currents flowing through the second and third current sources 150 and 160 are substantially similar to each other.

Further, in one exemplary embodiment of the present invention, the first current source 140 includes a first variable source transistor gated by a first variable bias voltage VNB1 and the fourth current source 170 includes a second variable source transistor gated by a second variable bias voltage VNB2 such that a sum of currents through the first and fourth current sources 140 and 170 is maintained at a predetermined constant level.

Figure 6:
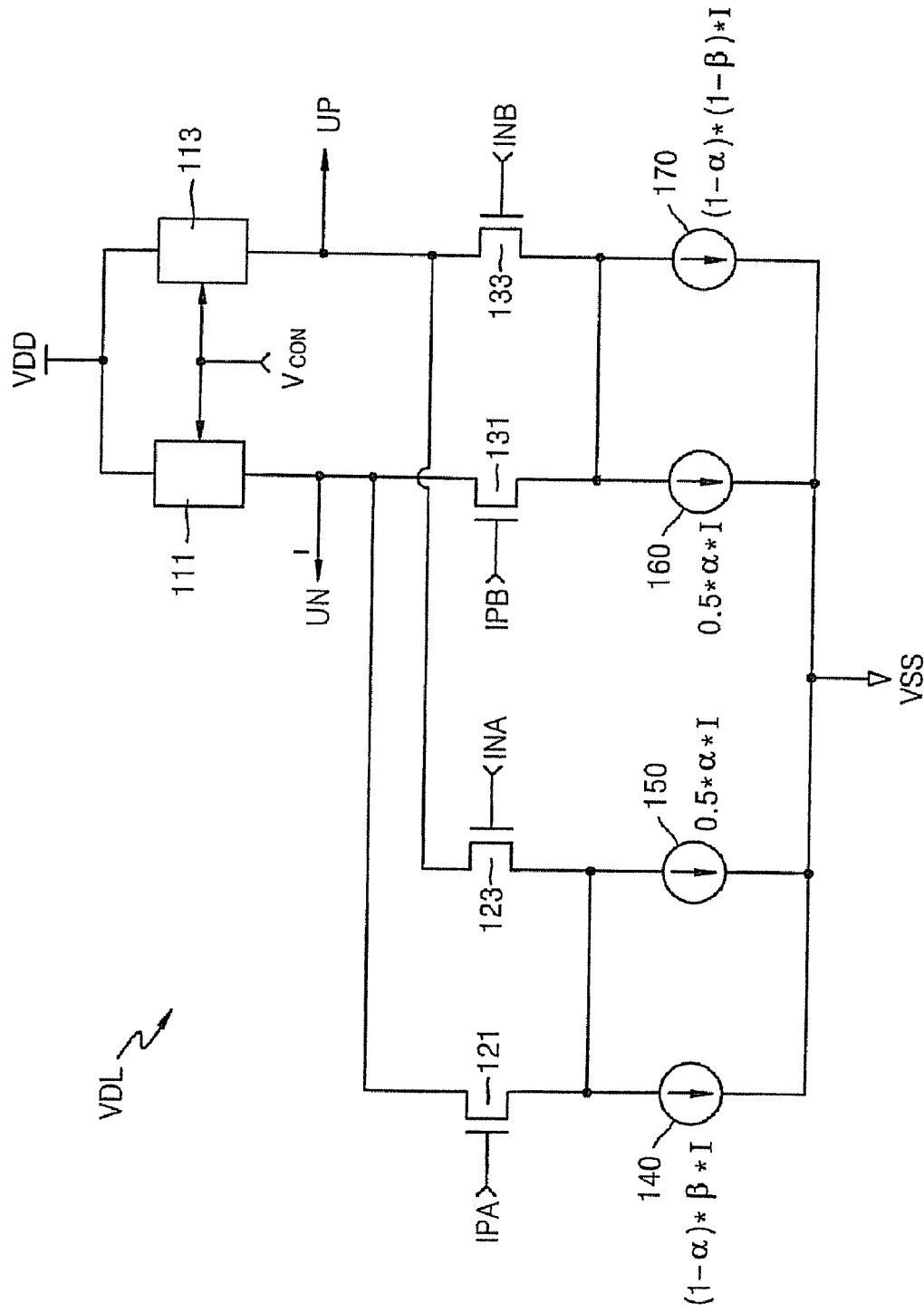
FIG. 6 is a schematic circuit diagram illustrating current flowing through elements of the variable delay circuit according to the exemplary embodiment of the present invention in FIG. 5.

FIG. 6 is a schematic circuit diagram illustrating current flowing through elements of the variable delay circuit according to the exemplary embodiment of the present invention in FIG. 5.

Referring to FIGS. 5 and 6, the total current I flowing through the variable delay circuit VDL is determined by the control voltage $V_{CON}$. More specifically, currents flowing through the second and third current sources 150 and 160 is equal to $0.5*\alpha*I$, where $0 \leq \alpha \leq 1$ and $\alpha$ is dependent upon the reference bias voltage VNB0 (FIG. 5) which gates the transistors of the second and third current sources 150 and 160.

Currents flowing through the first and fourth current sources 140 and 170 are equal to $(1-\alpha)*\beta*I$ and $I(1-\alpha)*(1-\beta)*I$, respectively, where $0 \leq \beta \leq 1$ and $\beta$ is determined by the first and second bias voltages VNB1 and VNB2 (FIG. 5) which gates the transistors of the first and fourth current sources 140 and 170.

Figure 7A:
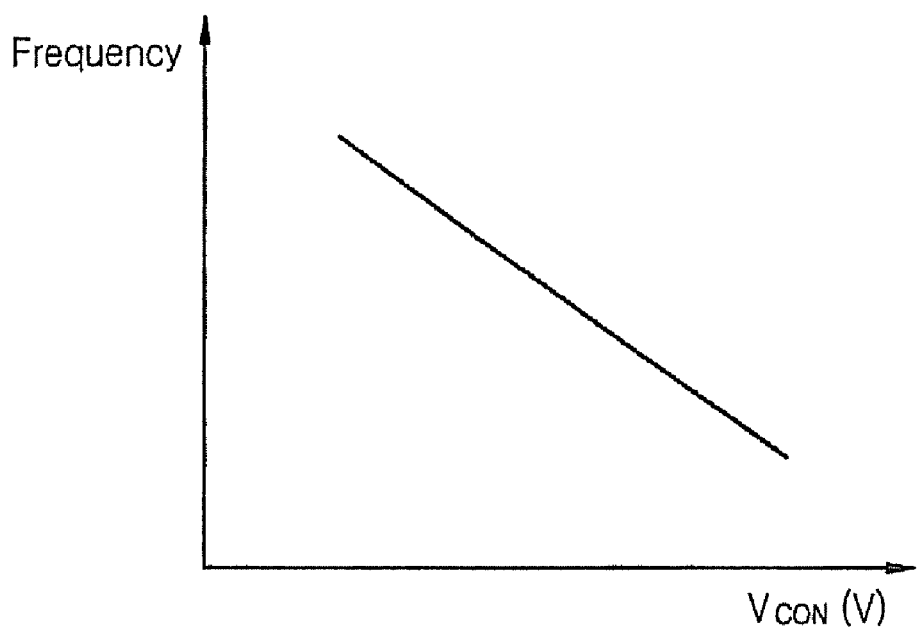
FIG. 7A is a graph of control voltage versus frequency of the variable delay circuit according to the exemplary embodiment of the present invention in FIGS. 5 and 6.
Figure 7B:
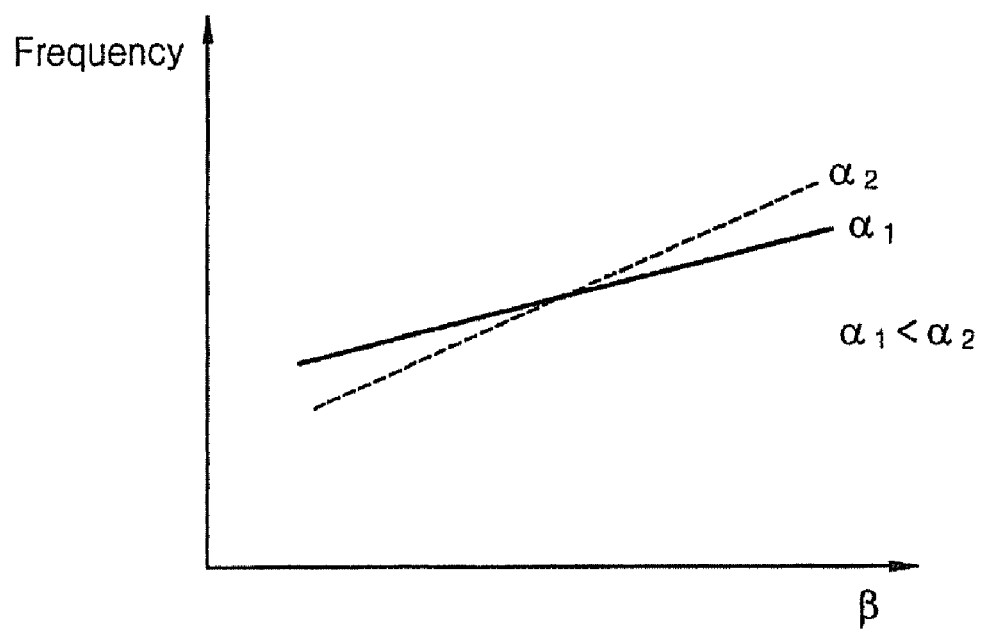
FIG. 7B is a graph of $\beta$ versus frequency, for given values of $\alpha$; of a differential output signal pair in the voltage-controlled oscillator employing the variable delay circuit according to the exemplary embodiment of the present invention in FIGS. 5 and 6.

FIG. 7A is a graph of control voltage versus frequency of the variable delay circuit according to the exemplary embodiment of the present invention in FIGS. 5 and 6 and FIG. 7B is a graph of $\beta$ versus frequency, for given values of $\alpha$, of a differential output signal pair in the voltage-controlled oscillator employing the variable delay circuit according to the exemplary embodiment of the present invention in FIGS. 5 and 6.

Referring to FIG. 7A, the control voltage $V_{CON}$ is used to coarsely set a frequency of the differential output signal pair for each variable delay circuit VDL of the voltage-controlled oscillator of one exemplary embodiment of the present invention.

More specifically, when the control voltage $V_{CON}$ increases, the current amount I (FIG. 6) is reduced to lower a frequency of the differential output signal pair UP/UN, as shown in FIG. 7A. In an exemplary embodiment, a frequency variation of the differential output signal pair UP/UN is relatively large for a given variation of the control voltage $V_{CON}$, e.g., the control voltage $V_{CON}$ functions to coarsely set a frequency of the voltage-controlled oscillator.

In contrast, a value of β is a factor for precisely setting a frequency of the differential output signal pair generated from each variable delay circuit VDL of the voltage-controlled oscillator.

More specifically and referring to FIG. 7B, when β increases for a given α, a frequency of the differential output signal pair UP/UN of the variable delay circuit increases. In one exemplary embodiment, a frequency variation of the differential output signal pair UP/UN is relatively small along a value of β, e.g., β functions to precisely set a frequency of the voltage-controlled oscillator, as described above.

Further, a value of α is a factor for precisely setting a frequency range to be precisely adjusted according to a value of β. More specifically, increasing a value of α, e.g., from $α_1$ to $α_2$ (referring again to FIG. 7B), increases a frequency range which is to be precisely adjusted by varying β.

As described above in reference to FIGS. 4 through 7, in the voltage-controlled oscillator according to one exemplary embodiment of the present invention a desired frequency of the differential output signal pair having a wide frequency range, precisely adjusted by α, is coarsely adjusted by a level of the control voltage $V_{CON}$, and a value of β is controlled to precisely adjust the frequency of the differential output signal pair.

Hereinafter, a bias voltage generation block which provides the reference bias voltage VNB0 and the first and second variable bias voltages VNB1 and VNB2 to the variable delay circuit VDL according to the exemplary embodiment of the present invention in FIG. 5 will be described in further detail with reference to FIG. 8.

Figure 8:
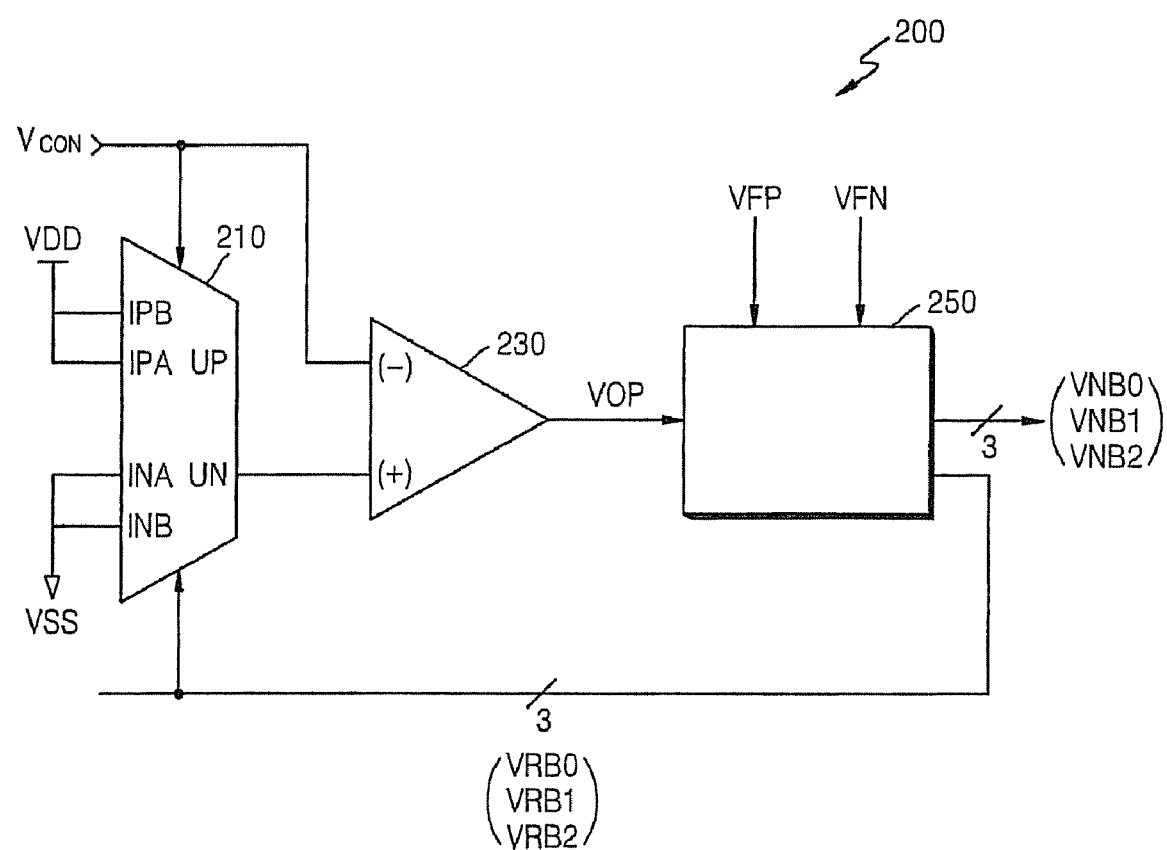
FIG. 8 is a schematic circuit diagram of a bias voltage generation block providing bias voltages to the variable delay circuit according to the exemplary embodiment of the present invention in FIG. 5.

FIG. 8 is a schematic circuit diagram of a bias voltage generation block providing bias voltages to the variable delay circuit according to the exemplary embodiment of the present invention in FIG. 5. Referring to FIG. 8, a bias voltage generation block 200 includes a copy circuit 210, a comparison amplifier 230, and a bias voltage generator 250.

The copy circuit 210 is similar to the variable delay circuit VDL of FIG. 5, with the exceptions, discussed in further detail later with reference to FIG. 9, of voltage levels and bias voltages applied to the first and second differential input signal pairs IPA/INA and IPA/IPB, for example, but not being limited thereto.

Still referring to FIG. 8, the comparison amplifier 230 compares a voltage of the output signal UN of the copy circuit 210 with the control voltage $V_{CON}$ and amplifies the compared result, generating a compared amplifying signal VOP. The compared amplifying signal VOP generated from the comparison amplifier 230 is provided to the bias voltage generator 250.

The bias voltage generator 250 receives the compared amplifying signal VOP, as well as a fine control signal VFP and a fine control signal VFN (hereinafter collectively referred to as a "fine control signal pair VFP/VFN"), and generates the reference bias voltage VNB0 and the first and second variable bias voltages VNB1 and VNB2 to be provided to the variable delay circuit VDL of FIG. 5.

Additionally, the bias voltage generator 250 feeds back a reference copy bias voltage VRB0 and first and second copy bias voltages VRB1 and VRB2, respectively, to the copy circuit 210.

Therefore, a voltage level of the compared amplifying signal VOP, e.g., a voltage level proportional to the differential output signal UN of the copy circuit 210, is substantially similar to, e.g., is substantially proportional to, the control voltage $V_{CON}$.

Figure 9:
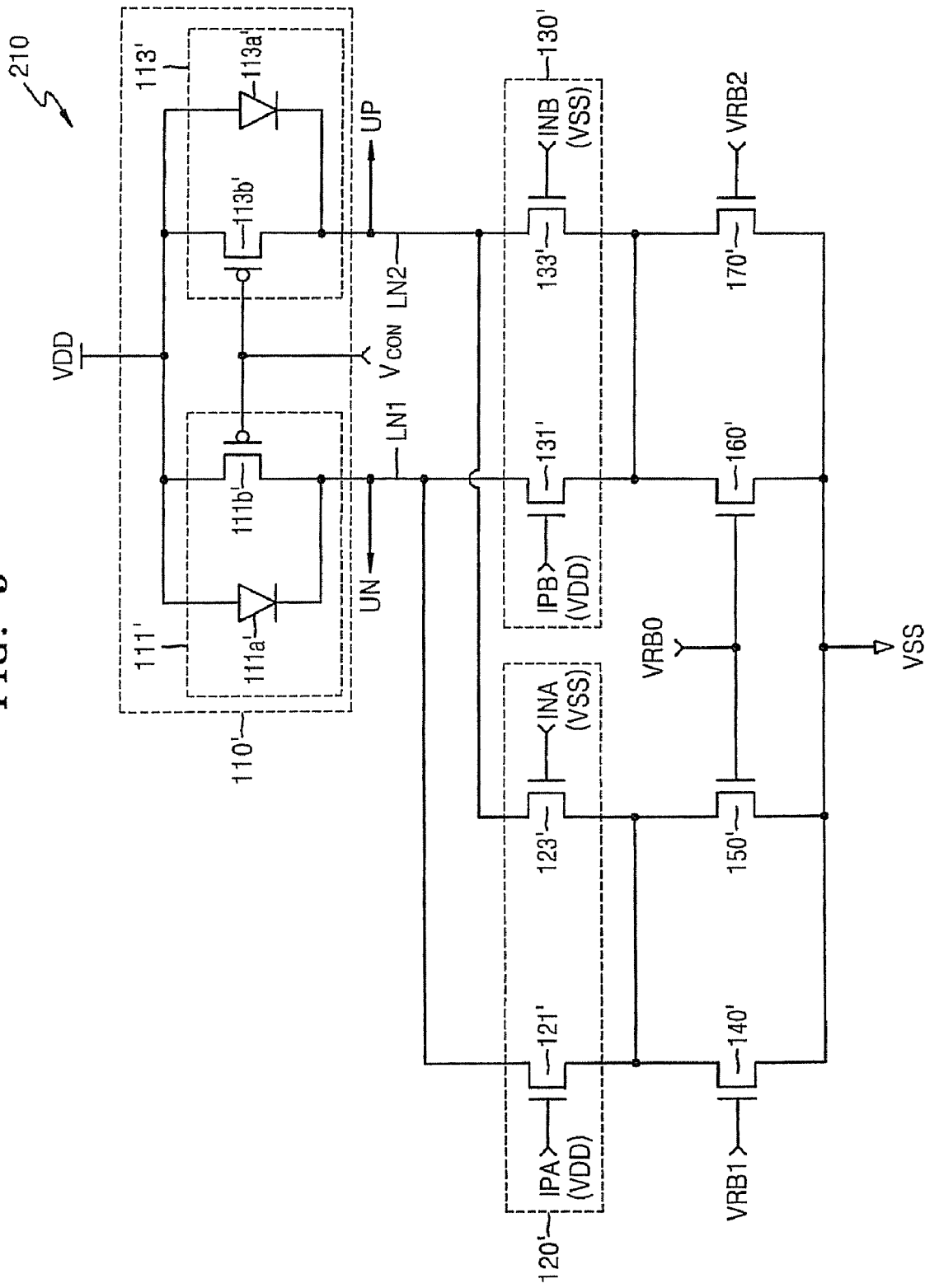
FIG. 9 is a schematic circuit diagram of a copy circuit of the bias voltage generation block according to the exemplary embodiment of the present invention in FIG. 8.

FIG. 9 is a schematic circuit diagram of the copy circuit 210 of the bias voltage generation block 200 according to the exemplary embodiment of the present invention in FIG. 8. As illustrated in FIG. 9, the copy circuit 210 is similar to the variable delay circuit VDL in FIG. 5, with the exception of signals provided thereto, as discussed below, for example, but not being limited thereto. Repetitive descriptions of similar components previously described in reference to FIG. 5 will be omitted. Further, components of the copy circuit 210 which are equivalent to components in FIG. 5 are marked with a single apostrophe ("'") in FIG. 9, e.g., a first current source 140' of FIG. 9 is substantially similar to the first current source 140 shown in FIG. 5.

In the copy circuit 210 shown in FIG. 9, the first differential input signal IPA is supplied as the power source voltage VDD, and the first differential input signal INA is supplied as the ground voltage VSS. Likewise, the second differential input signal IPB is supplied as the power source voltage VDD, and the second differential input signal INB is supplied as the ground voltage VSS. Transistors forming second and third current sources 150' and 160', respectively, are commonly supplied with the reference copy bias voltage VRB0, and transistors forming first and fourth current sources 140' and 170', respectively, are supplied with the first and second copy bias voltages VRB1 and VRB2, respectively.

Figure 10:
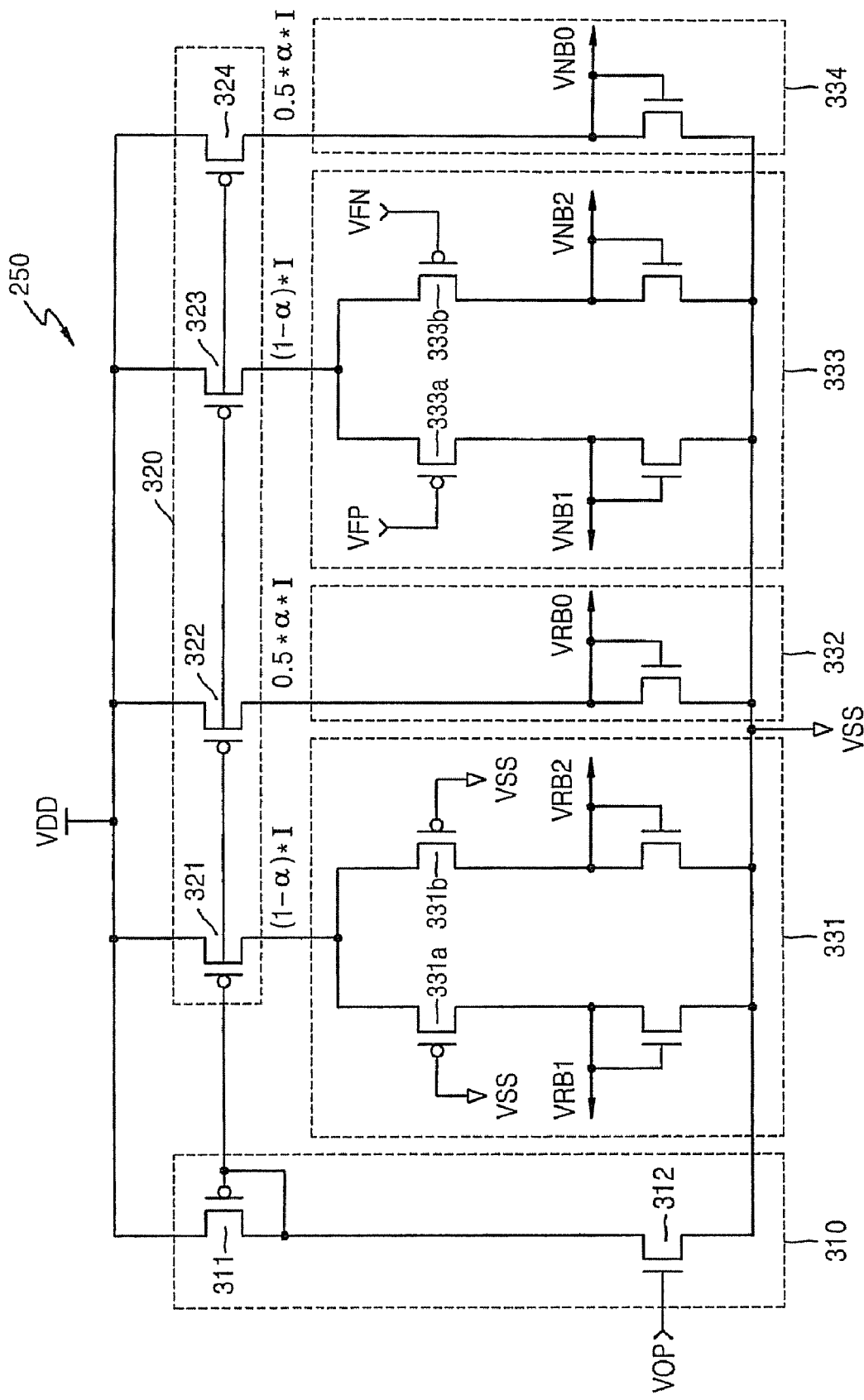
FIG. 10 is a schematic circuit diagram of a bias voltage generator of the bias voltage generation block according to the exemplary embodiment of the present invention in FIG. 8.

FIG. 10 is a schematic circuit diagram of the bias voltage generator 250 of the bias voltage generation block 200 according to the exemplary embodiment of the present invention in FIG. 8. Referring to FIG. 10, in a reference source circuit 310, a current according to a voltage level of the compared amplifying signal VOP flows through a p-channel metal-oxide semiconductor ("PMOS") transistor 311 and an NMOS transistor 312.

PMOS transistors 321, 322, 323 and 324 of a current mirror 320 form a current mirror loop with the PMOS transistor 311. A predetermined current flows in the current loop. More specifically as shown in FIG. 10, a first current equal to $(1-α)*I$ flows in a portion of the loop connected to the PMOS transistor 321, second and third currents equal to $0.5*α*I$ flow in portions of the loop connected to the PMOS transistors 322 and 324, respectively, and a fourth current equal to $(1-α)*I$ flows in a portion of the loop connected to the PMOS transistor 323.

The first and second copy bias voltages VRB1 and VRB2 are generated from a first source circuit 331, wherein PMOS transistors 331a and 331b of the first source circuit 331 are both gated with the ground voltage VSS. Thus, a current flowing through the PMOS transistor 331a and a current flowing through the PMOS transistor 331b are substantially equivalent to each other and are equal to $(1-α)*0.5*I$. The first and second copy bias voltages VRB1 and VRB2 correspond to the first and second variable bias voltages VNB1 and VNB2 when a value of β is 0.5. Thus, the first and second copy bias voltages VRB1 and VRB2 act as levels which set the middle value of β.

The reference copy bias voltage VRB0 is generated from a second source circuit 332.

The first and second variable bias voltages VNB1 and VNB2 are generated by a third source circuit 333, wherein PMOS transistors 333a and 333b of the third source circuit 333 are gated by the fine control signal pair VFP/VFN, as shown in FIG. 10. Thus, the first and second variable bias voltages VNB1 and VNB2 provided from the third source circuit 333 are controlled by the fine control signal pair VFP/VFN. Further, a value of β is adjusted by the first and second variable bias voltages VNB1 and VNB2.

Finally, the reference bias voltage VNB0 is generated from a fourth source circuit 334.

Figure 11:
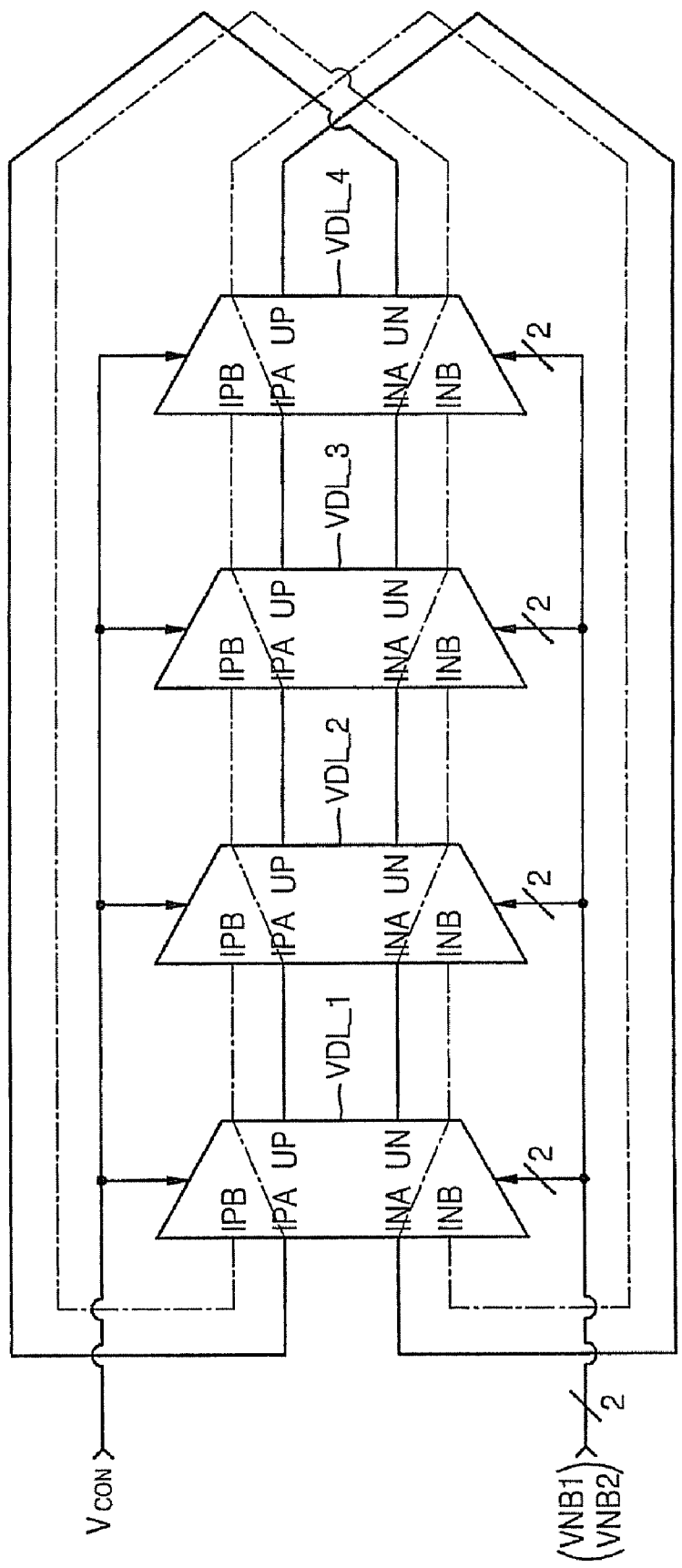
FIG. 11 is a schematic circuit diagram of a voltage-controlled oscillator according to an alternative exemplary embodiment of the present invention.
Figure 12:
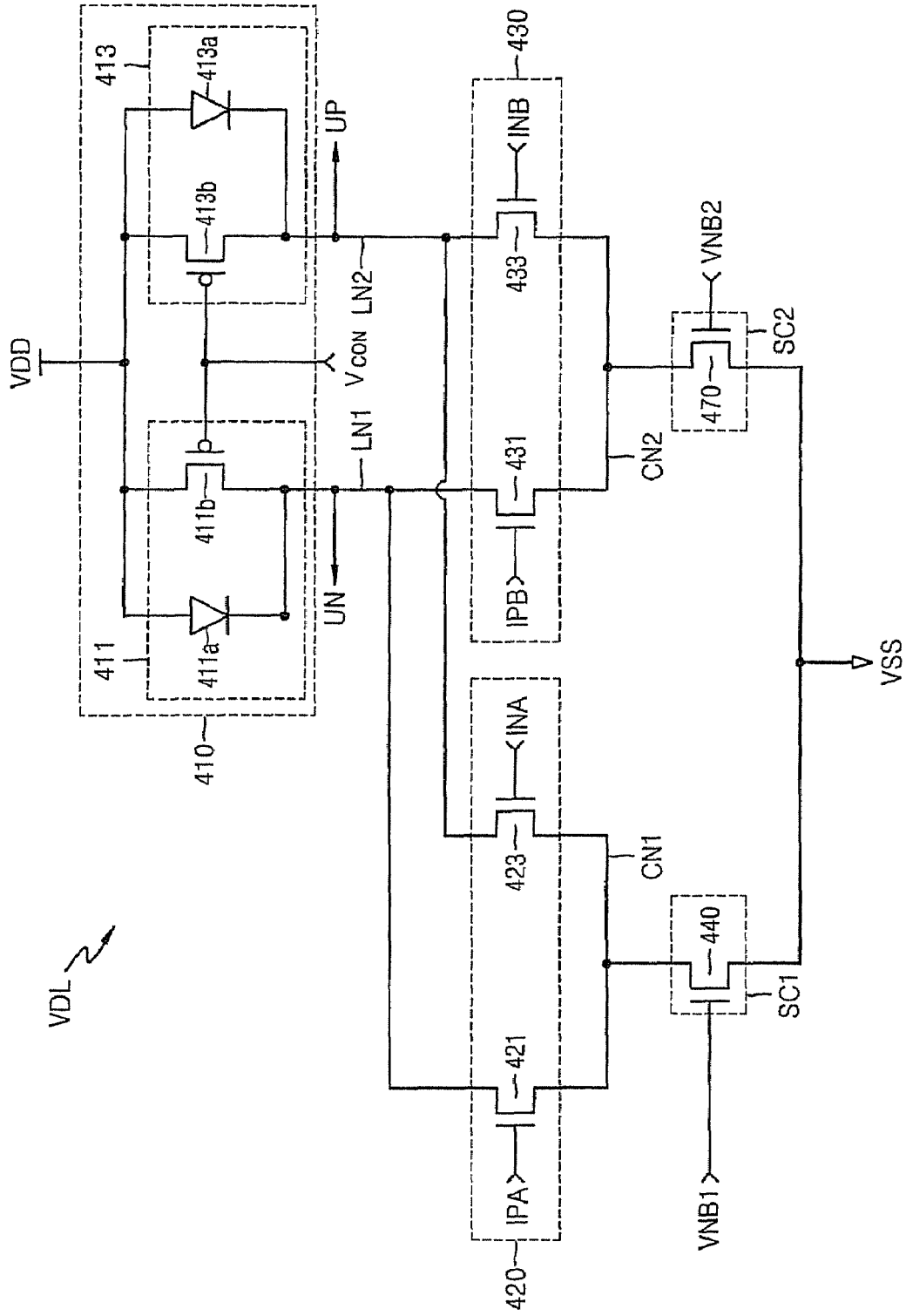
FIG. 12 is a schematic circuit diagram of a variable delay circuit of the voltage-controlled oscillator according to the alternative exemplary embodiment of the present invention in FIG. 11.

In an alternative exemplary embodiment of the present invention, a single current source is used in each of the first and second source circuits SC1 and SC2 (FIG. 5), as will be described in further detail hereinafter with reference to the accompanying drawings. 10 FIG. 11 is a schematic circuit diagram of a voltage-controlled oscillator according to an alternative exemplary embodiment of the present invention and FIG. 12 is a schematic circuit diagram of a variable delay circuit of the voltage-controlled oscillator according to the alternative exemplary embodiment of the present invention in FIG. 11. Repetitive descriptions of similar components previously described in reference to FIGS. 1 through 10 will hereinafter be omitted.

Referring to FIGS. 11 and 12, a variable delay circuit VDL according to an alternate exemplary embodiment of the present invention includes a loading circuit 410, the loading circuit 410 having first and second loading units 411 and 413, respectively, the first and second loading units 411 and 413 each having first and second loading diodes 411a and 413a, respectively, as well as first and second loading transistors 111b and 113b, respectively. Further, first and second input circuits 420 and 430, respectively, of the variable delay circuit VDL include first, second, third and fourth input transistors 421, 423, 431 and 433, respectively.

Further referring to FIG. 12, a first source circuit SC1 includes a first single current source 440 connected between a first common node CN1 and a second power source VSS and a second source circuit SC2 includes a second single current source 470 connected between a second common node CN2 and the second power source VSS.

Figure 13:
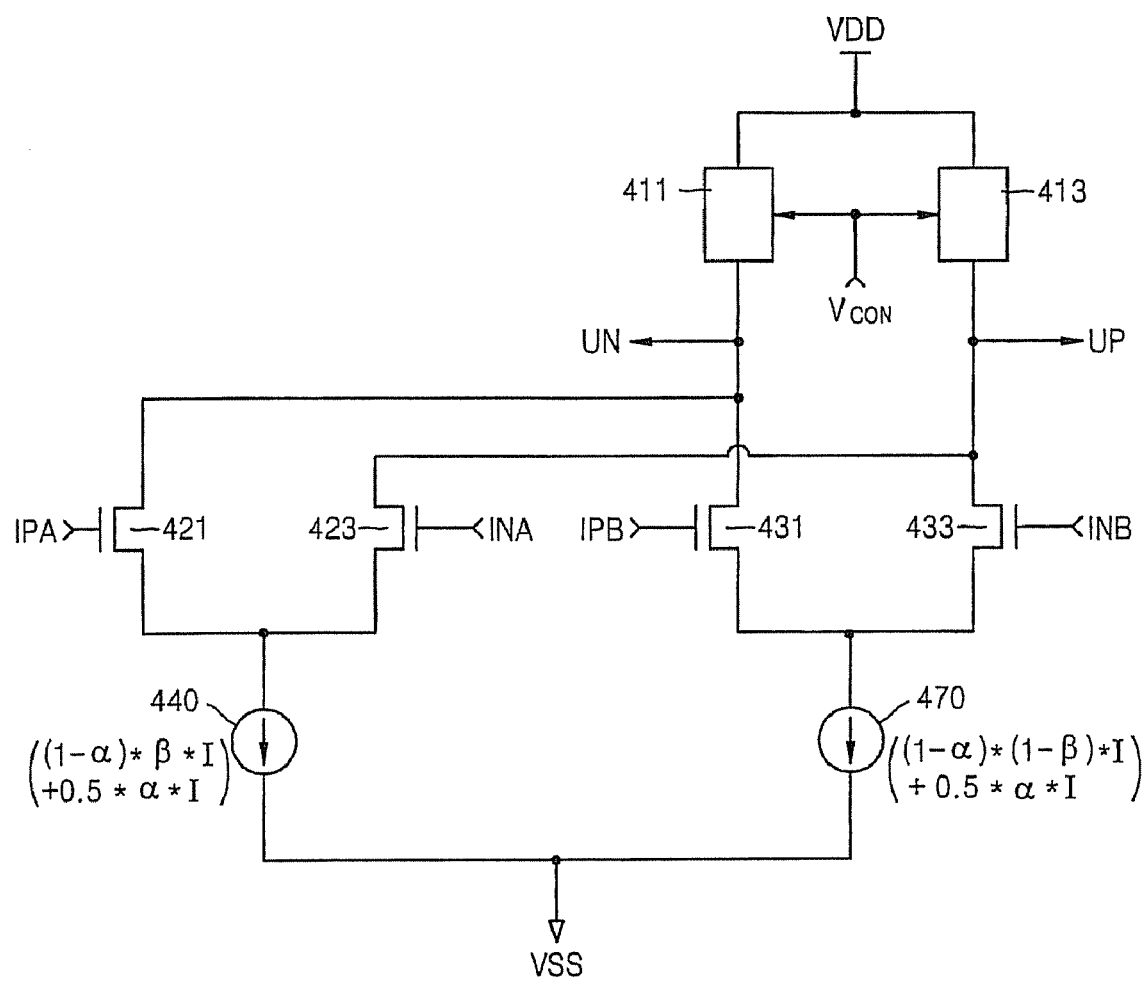
FIG. 13 is a schematic circuit diagram illustrating current flowing through elements of the variable delay circuit of the voltage-controlled oscillator according to the alternative exemplary embodiment of the present invention in FIG. 12.

FIG. 13 is a schematic circuit diagram illustrating current flowing through elements of the variable delay circuit VDL of the voltage-controlled oscillator according to the alternative exemplary embodiment of the present invention in FIG. 12.

Referring to FIGS. 12 and 13, a current flowing through the first single current source 440 is a sum of currents flowing through the first and second input transistors 421 and 423 and is equal to $((1-\alpha)*\beta*I)+(0.5*\alpha*I)$, e.g., is equal to a sum of currents flowing through the first and second current sources 140 and 150 of the exemplary embodiment described above in reference to FIG. 6. Likewise, a current flowing through the second single current source 470 is a sum of currents flowing through the third and fourth input transistors 431 and 433 and is equal to $((1-\alpha)*(1-\beta))+(0.5*\alpha*I)$, e.g., is equal to a sum of currents flowing through the third and fourth current sources 160 and 170 of the exemplary embodiment described above in reference to FIG. 6. 20 Further, according to the exemplary embodiment of the present invention in FIGS. 12 and 13, in the variable delay circuit VDL of the voltage-controlled oscillator of the present invention, a desired frequency of a differential output signal pair UP/UN (FIG. 4) is coarsely determined by a level of a control voltage $V_{CON}$. In addition, a value of β is controlled to precisely adjust the frequency of the differential output signal pair UP/UN, as described in greater detail above.

Figure 14:
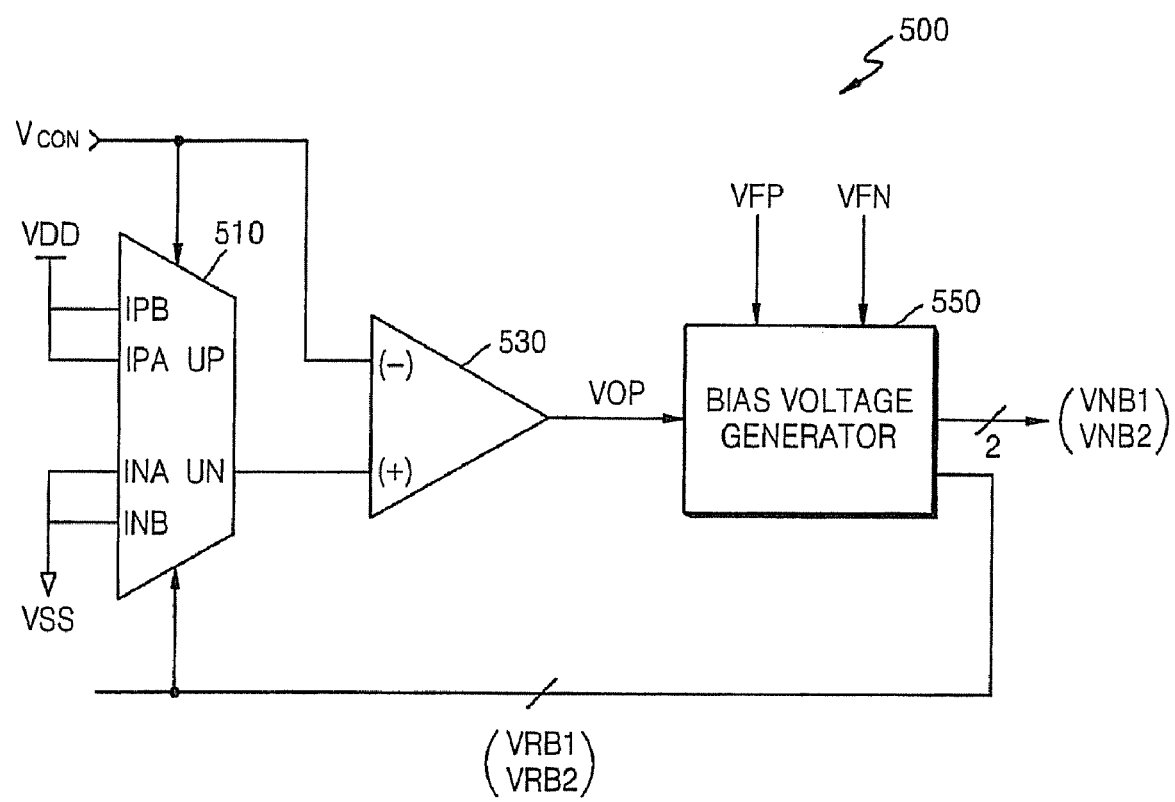
FIG. 14 is a schematic circuit diagram of a bias voltage generation block providing bias voltages to the variable delay circuit of the voltage-controlled oscillator according to the alternative exemplary embodiment of the present invention in FIG. 12.

FIG. 14 is a schematic circuit diagram of a bias voltage generation block 500 which provides bias voltages to the variable delay circuit of the voltage-controlled oscillator according to the alternative exemplary embodiment of the present invention in FIG. 12. Referring to FIG. 14, the bias voltage generation block 500 according to an alternate exemplary embodiment of the present invention includes the copy circuit 510, a comparison amplifier 530 and a bias voltage generator 550.

Repetitive detailed descriptions of substantially similar components will hereinafter be omitted.

The bias voltage generation block 500 is similar to the bias voltage generation block 200 of the exemplary embodiment of the present invention shown in FIG. 8, with some exceptions, e.g., the number of bias voltages, the number of buses for the bias voltages and a structure of a copy circuit 510, but are not limited thereto, described in further detail below.

In the bias voltage generation block 500 of an alternative exemplary embodiment of the invention, the bias voltage generator generates first and second variable bias voltages VNB1 and VNB2, respectively. Further, the bias voltage generator 550 feeds back first and second copy bias voltages VRB1 and VRB2, respectively, to the copy circuit 510.

Figure 15:
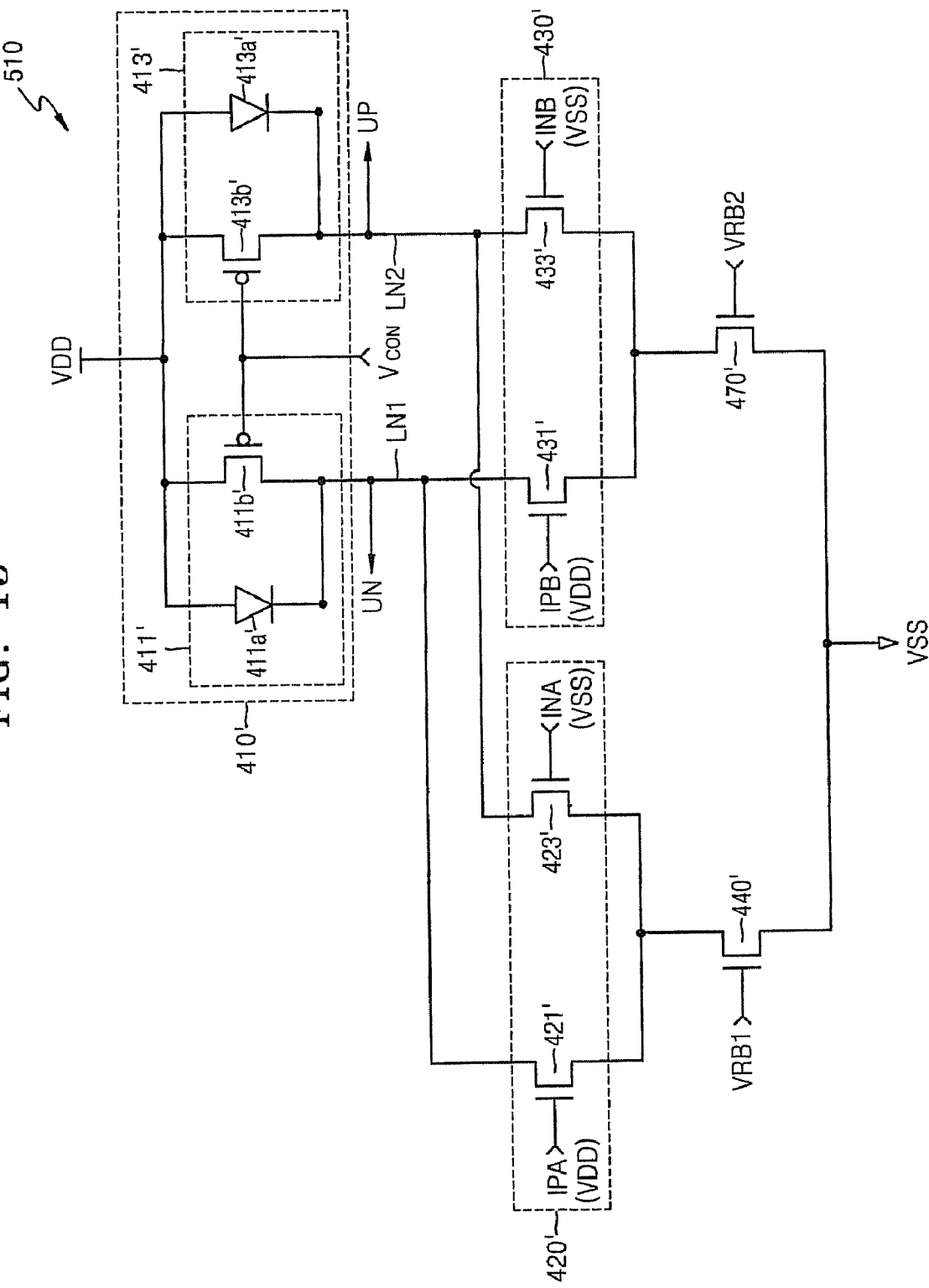
FIG. 15 is a schematic circuit diagram of a copy circuit of the bias voltage generation block according to the alternative exemplary embodiment of the present invention in FIG. 14.

FIG. 15 is a schematic circuit diagram of the copy circuit 510 of the bias voltage generation block 500 according to the alternative exemplary embodiment of the present invention in FIG. 14. As illustrated in FIG. 15, the copy circuit 510 is similar to the variable delay circuit VDL shown in FIG. 12, except for signals provided thereto, for example, but not being limited thereto. Repetitive detailed descriptions of common components are omitted hereinafter. Further, components of the copy circuit 510 which are equivalent to components in FIG. 12 are marked with a single apostrophe ("'") in FIG. 15, e.g., a loading circuit 410' of FIG. 15 is substantially similar to the loading circuit 410 of FIG. 12.

Referring to FIG. 15, the first differential input signal IPA is supplied as the power source voltage VDD, and the first differential input signal INA is supplied as the ground voltage VSS. Likewise, the second differential input signal IPB is supplied as the power source voltage VDD, and the second differential input signal INB is supplied as the ground voltage VSS. Transistors forming first and second single current sources 440' and 470', respectively, are commonly supplied with the reference copy bias voltage VRB0, and transistors forming first and fourth current sources 440' and 470', respectively, are supplied with the first and second copy bias voltages VRB1 and VRB2, respectively.

Figure 16:
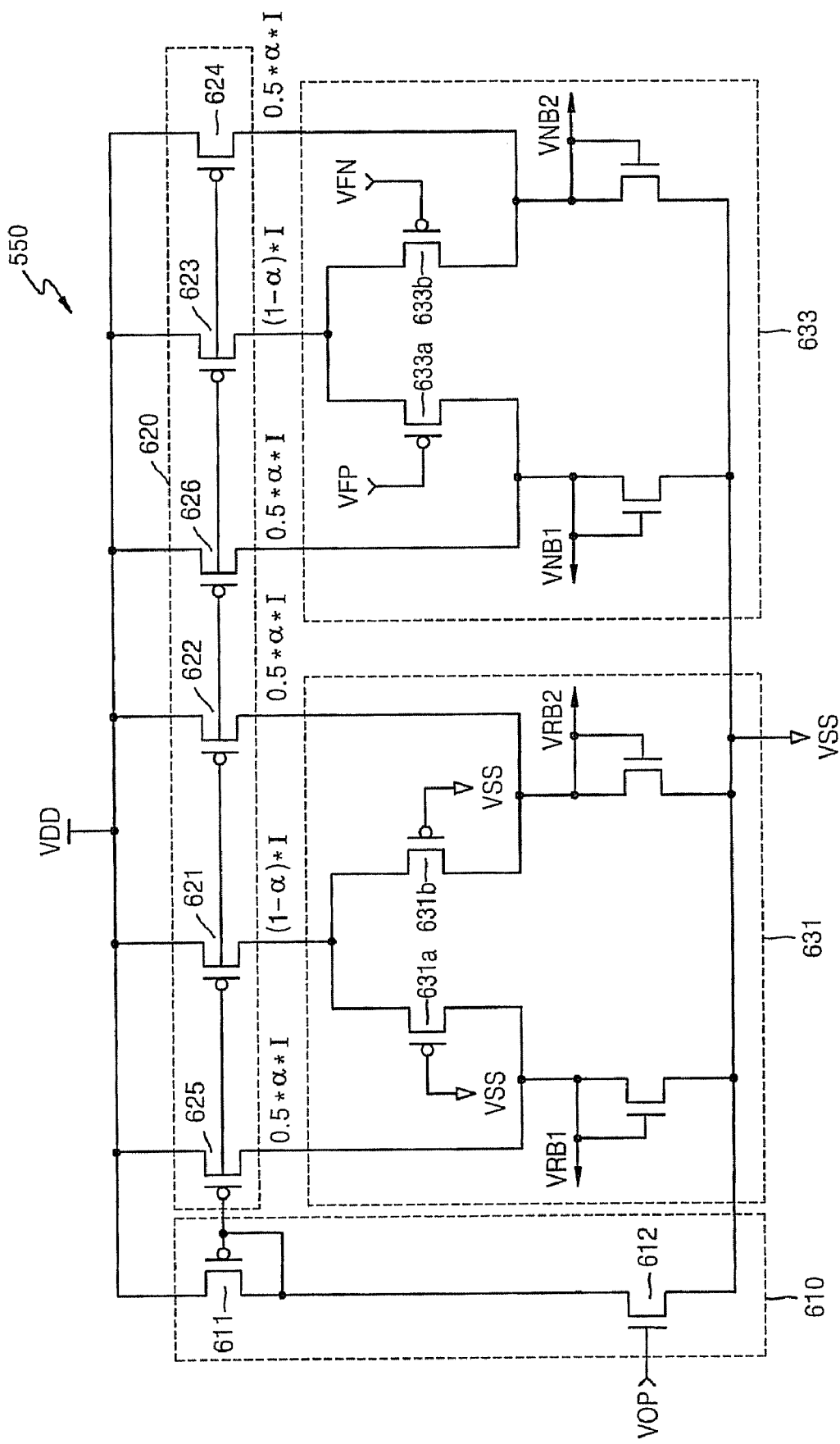
FIG. 16 is a schematic circuit diagram of the bias voltage generator of the bias voltage generation block according to the alternative exemplary embodiment of the present invention in FIG. 14.

FIG. 16 is a schematic circuit diagram of a bias voltage generator 550 of the bias voltage generation block according to the alternative exemplary embodiment of the present invention in FIG. 14. Repetitive descriptions of common components are omitted hereinafter. Referring to FIG. 16, in a reference source circuit 610 of the bias voltage generator 550, a current according to a voltage level of a compared amplifying signal VOP flows from PMOS and NMOS transistors 611 and 612, respectively.

A current mirror 620 forms a current mirror loop with the PMOS transistor 611. A predetermined current flows in the current loop. More specifically as shown in FIG. 16, first and second currents equal to $(1-\alpha)*I$ flow in portions of the loop connected to the PMOS transistors 621 and 623, respectively, while third through sixth currents equal to $0.5*\alpha*I$ flow in portions of the loop connected to the PMOS transistors 622, 624, 625 and 626, respectively.

Further, a first source circuit 631 includes PMOS transistors 631*a* and 631*b*, and generates first and second copy bias voltages VRB1 and VRB2 and a second source circuit 633 includes PMOS transistors 633*a* and 633*b*, and generates first and second variable bias voltages VNB1 and VNB2.

In the voltage-controlled oscillator according to the exemplary embodiments of the present invention described herein, a frequency of the differential output signal pair is coarsely determined by a level of the control voltage $V_{CON}$. Then, a value of β is controlled to precisely adjust the frequency of the differential output signal pair. Therefore, with the voltage-controlled oscillator and the variable delay circuits included therein, it is possible to precisely adjust the frequency of the differential output signal pair while offering a wide range of frequency.

Although the present invention has been described in connection with the exemplary embodiments of the present invention described herein, it is not limited thereto. For example, the exemplary embodiments described above include the variable delay circuit of the voltage-controlled oscillator, wherein a differential output signal pair of the first, e.g., adjacent, previous stage variable delay circuit is provided for a first differential input signal pair and a differential output signal pair of the second previous stage variable delay circuit is provided for a second differential input signal pair.

In alternative exemplary embodiments, a differential output signal pair of the first, e.g., adjacent, previous state variable delay circuit is provided for the first differential input signal pair and a differential output signal pair of the third or another previous stage variable delay circuit may be provided for the second input signal pair, for example, but is not limited thereto.

In addition, the first voltage is the power source voltage VDD and the second voltage is the ground voltage VSS in the exemplary embodiments described above. However, in alternate exemplary embodiment, the first voltage may be the ground voltage VSS and the second voltage may be the power source voltage VDD, for example, but are not limited thereto.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A variable delay circuit comprising:
   a first loading node and a second loading node;
   a first common node and a second common node;
   a loading circuit including
      a first loading unit disposed between a first power source and the first loading node; and
      a second loading unit disposed between the first power source and the second loading node;
   a first input circuit including
      a first input transistor disposed between the first loading node and the first common node; and
      a second input transistor disposed between the second loading node and the first common node,
      the first input transistor and the second input transistor being gated by a first differential input signal and a second differential input signal, respectively;
   a second input circuit including
      a third input transistor disposed between the first loading node and the second common node;
      and a fourth input transistor disposed between the second loading node and the second common node,
      the third input transistor and the fourth input transistor being gated by a third differential input signal and a fourth differential input signal, respectively;
   a first source circuit disposed between the first common node and a second power source; and
   a second source circuit disposed between the second common node and the second power source,
   wherein the first source circuit comprises a first current source and a second current source connected in electrical parallel with each other and disposed between the first common node and the second power source, and
   wherein the second source circuit comprises a third current source and a fourth current source connected in electrical parallel with each other and disposed between the second common node and the second power source,
   wherein the second current source and the third current source are supplied with a bias current.

2. The variable delay circuit of claim 1, wherein the second current source comprises a first reference source transistor disposed between the first common node and the second power source,
   wherein the third current source comprises a second reference source transistor disposed between the second common node and the second power source, and
   wherein the first reference source transistor and the second reference source transistor are gated by a reference bias voltage.

3. The variable delay circuit of claim 1, wherein the first current source and the fourth current source are configured to maintain a current sum through the first and fourth current sources at a predetermined level.

4. The variable delay circuit of claim 3, wherein the first current source comprises a first variable source transistor gated by a first variable bias voltage, and
   wherein the second current source comprises a second variable source transistor gated by a second variable bias voltage.

5. The variable delay circuit of claim 1, wherein the first loading unit comprises a first diode and a first loading transistor connected in electrical parallel with each other and disposed between the first power source and the first loading node, and
   wherein the second loading unit comprises a second diode and a second loading transistor connected in electrical parallel with each other and disposed between the first power source and the second loading node.

6. The variable delay circuit of claim 5, wherein the first loading transistor and the second loading transistor are gated by a control voltage.

7. A voltage-controlled oscillator comprising:
   a plurality of variable delay circuits, each of which receives a first differential output signal of an adjacent, e.g., a first previous, stage as a first differential input signal and receives a second differential output signal of an n-th previous stage (where n is an integer and n≧2) as a second differential input signal,
   wherein each variable delay circuit comprises:
      a first loading node and a second loading node;
      a first common node and a second common node;
      a loading circuit including
         a first loading unit disposed between a first power source and the first loading node; and
         a second loading unit disposed between the first power source and the second loading node;
      a first input circuit including a first input transistor disposed between the first loading node and the first common node; and a second input transistor disposed between the second loading node and the first common node, the first input transistor and the second input transistor being gated by the first differential input signal;

a second input circuit including a third input transistor disposed between the first loading node and the second common node; and a fourth input transistor disposed between the second loading node and the second common node, the third input transistor and the fourth input transistor being gated by the second differential input signal;

a first source circuit disposed between the first common node and a second power source; and a second source circuit disposed between the second common node and the second power source, wherein the first source circuit comprises a first current source and a second current source connected in electrical parallel with each other and disposed between the first common node and the second power source, and wherein the second source circuit comprises a third current source and a fourth current source connected in electrical parallel with each other and disposed between the second common node and the second power source, wherein the second current source and the third current source are supplied with a bias current.

8. The voltage-controlled oscillator of claim 7, wherein the second current source comprises a first reference source transistor disposed between the first common node and the second power source, wherein the third current source comprises a second reference source transistor disposed between the second common node and the second power source, and wherein the first reference source transistor and the second reference source transistor are gated by a reference bias voltage.

9. The voltage-controlled oscillator of claim 7, wherein the first current source and the fourth current source are configured to maintain a current sum through the first current source and the fourth current source at a predetermined level.

10. The voltage-controlled oscillator of claim 9, wherein the first current source comprises a first variable source transistor gated by a first variable bias voltage, and wherein the second current source comprises a second variable source transistor gated by a second variable bias voltage.

11. The voltage-controlled oscillator of claim 7, wherein the first loading unit comprises a first diode and a first loading transistor connected in electrical parallel with each other and disposed between the first power source and the first loading node, and wherein the second loading unit comprises a second diode and a second loading transistor connected in electrical parallel with each other and disposed between the first power source and the second loading node.

12. The voltage-controlled oscillator of claim 11, wherein the first loading transistor and the second loading transistor are gated by a control voltage.

13. The voltage-controlled oscillator of claim 7, wherein n is equal to 2.

* * * * *